(12) United States Patent
Yamamoto

(10) Patent No.: US 8,519,727 B2
(45) Date of Patent: Aug. 27, 2013

(54) CONTACT PROBE AND SOCKET

(75) Inventor: Tsugio Yamamoto, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 363 days.

(21) Appl. No.: 12/767,391

(22) Filed: Apr. 26, 2010

(65) Prior Publication Data

US 2010/0271061 A1   Oct. 28, 2010

(30) Foreign Application Priority Data

Apr. 27, 2009 (JP) .................. P2009-108510

(51) Int. Cl.
*G01R 1/067* (2006.01)
*H01R 12/00* (2006.01)

(52) U.S. Cl.
USPC ............... 324/755.05; 324/755.06; 439/66

(58) Field of Classification Search
USPC ............ 324/755.01, 755.04–755.11; 439/66; 29/874
See application file for complete search history.

(56) References Cited

U.S. PATENT DOCUMENTS

| | | | | |
|---|---|---|---|---|
| 4,385,754 | A * | 5/1983 | Waite | 267/71 |
| 5,174,763 | A | 12/1992 | Wilson | |
| 6,396,293 | B1 * | 5/2002 | Vinther et al. | 324/755.05 |
| 6,462,567 | B1 * | 10/2002 | Vinther et al. | 324/754.14 |
| 6,506,082 | B1 * | 1/2003 | Meek et al. | 439/700 |
| 6,769,919 | B2 * | 8/2004 | Kosmala | 439/66 |
| 6,821,131 | B2 * | 11/2004 | Suzuki et al. | 439/73 |
| 7,025,602 | B1 * | 4/2006 | Hwang | 439/66 |
| 7,256,593 | B2 * | 8/2007 | Treibergs | 324/754.05 |
| 7,467,952 | B2 * | 12/2008 | Hsiao et al. | 439/66 |
| 7,545,159 | B2 * | 6/2009 | Winter | 324/755.05 |
| 7,559,769 | B2 * | 7/2009 | Hsiao et al. | 439/66 |
| 7,559,806 | B2 * | 7/2009 | Lin et al. | 439/700 |
| 7,626,408 | B1 * | 12/2009 | Kaashoek | 324/755.05 |
| 7,772,865 | B2 * | 8/2010 | Tan | 324/762.02 |
| 7,789,671 | B2 * | 9/2010 | Hsieh et al. | 439/66 |
| 7,841,864 | B2 * | 11/2010 | Hsiao et al. | 439/66 |
| 7,845,988 | B2 * | 12/2010 | Hsiao et al. | 439/700 |
| 7,868,635 | B2 * | 1/2011 | Ishizuka | 324/755.07 |
| 7,946,855 | B2 * | 5/2011 | Osato | 439/66 |
| 7,972,184 | B2 * | 7/2011 | Hsieh et al. | 439/700 |

(Continued)

FOREIGN PATENT DOCUMENTS

| | | |
|---|---|---|
| JP | 62-58170 | 3/1987 |
| JP | 4-270967 | 9/1992 |

(Continued)

OTHER PUBLICATIONS

Notification of Reasons for Refusal dated Jan. 31, 2013 from the Japanese Patent Office in counterpart application No. 2009-108510.

*Primary Examiner* — Joshua Benitez-Rosario
(74) *Attorney, Agent, or Firm* — Morgan, Lewis & Bockius LLP

(57) ABSTRACT

A contact probe include: a first plunger to be connected to an object to be inspected; a second plunger to be connected to a board for inspection; and a spring operable to urge the first and second plungers in directions of moving the first and second plungers apart from each other. A pillar part of one of the first and second plungers is slidably engaged with an inner periphery of a tubular part of the other of the first and second plungers. The pillar part includes an elastically deformable part which is in contact with a part of the inner periphery of the tubular part.

6 Claims, 8 Drawing Sheets

(56) References Cited

U.S. PATENT DOCUMENTS

| | | | |
|---|---|---|---|
| 8,033,872 B2 * | 10/2011 | Yang et al. | 439/700 |
| 8,157,601 B2 * | 4/2012 | Lin et al. | 439/700 |
| 8,310,255 B2 * | 11/2012 | Shiga | 324/754.01 |
| 8,344,747 B2 * | 1/2013 | Kazama et al. | 324/755.01 |
| 8,373,430 B1 * | 2/2013 | Sochor | 324/755.05 |
| 2008/0042676 A1 | 2/2008 | Yamada et al. | 324/757 |
| 2010/0123476 A1 * | 5/2010 | Kazama et al. | 324/757 |

FOREIGN PATENT DOCUMENTS

| | | |
|---|---|---|
| JP | 6-28699 | 8/1994 |
| JP | 06-28699 U | 8/1994 |
| JP | 2008-045986 | 2/2008 |
| JP | 2010-25844 | 2/2010 |

* cited by examiner

PRIOR ART

PRIOR ART

CONTACT PROBE AND SOCKET

BACKGROUND OF THE INVENTION

The present invention relates to a contact probe which is used for inspecting a semiconductor integrated circuit and the like, and a socket provided with the contact probe.

In case of conducting inspection of an object to be inspected such as a semiconductor integrated circuit, a contact probe is generally used in order to electrically connect the object to be inspected to a board for inspection provided at a measuring instrument side.

A related-art contact probe will be described referring to FIGS. 7A and 7B. FIG. 7A shows an entire structure of the contact probe. FIG. 7B shows, in an enlarged scale, an encircled part Q in FIG. 7A which indicates an internal contact point of the contact probe. As shown in FIGS. 7A, 7B, the contact probe of this type has such a structure that a first plunger 61, which is a connecting component with respect to the object to be inspected such as the semiconductor integrated circuit, is directly contacted with a second plunger 62, which serves as a connecting component to the board for inspection, for the purpose of reducing a passing resistance of electricity. A contact point between the object to be inspected and the board for inspection is secured by butting the first and second plungers 61, 62 respectively to the object to be inspected and the board for inspection with a spring force generated by compressing a coil spring 63, which is a component of the contact probe. The internal contact point of the contact probe, which corresponds to an engagement point at which a columnar part of the first plunger 61 and a cylindrical part of the second plunger 62 are engaged with each other, has a clearance (play) for smooth sliding movement, as shown in FIG. 7B. For this reason, a contact state has not been stabilized, and the passing resistance has been unstable. JP-A-4-270967 discloses a similar structure.

Moreover, JP-B-6-28699U discloses an art for bringing the first plunger into contact with the second plunger. However, this art cannot be put into practice, in case where diameters of the plungers are further smaller, because working technique with high accuracy is required.

In case of the related-art contact probe as shown in FIGS. 7A and 7B, there is a problem that the passing resistance is unstable due to the clearance of the internal contact point of the contact probe. Moreover, the related-art structure disclosed in JP-B-6-28699U cannot be applied to a case where electrodes are arranged at a small pitch on the object to be inspected such as the semiconductor integrated circuit, because the structure requires the working technique with high accuracy.

SUMMARY

It is therefore an object of the invention to provide a a contact probe which can connect an object to be inspected such as a semiconductor integrated circuit to a board for inspection at a low resistance in an electrically stabilized state, and a socket provided with the contact probe.

It is also an object of the invention to provide a contact probe which can be produced by common working technique, even in case where an outer diameter of a finished product of the contact probe is extremely small, and a socket provided with the contact probe.

In order to achieve the object, according to the invention, there is provided a contact probe comprising:

a first plunger to be connected to an object to be inspected;

a second plunger to be connected to a board for inspection; and a spring operable to urge the first and second plungers in directions of moving the first and second plungers apart from each other, wherein a pillar part of one of the first and second plungers is slidably engaged with an inner periphery of a tubular part of the other of the first and second plungers, the pillar part includes an elastically deformable part which is in contact with a part of the inner periphery of the tubular part.

The elastically deformable part may be in contact with the part of the inner periphery of the tubular part with a repulsive force generated by elastic deformation.

The elastically deformable part may include end portions and an intermediate portion between the end portions, and the intermediate portion may be smaller than the end portions in diameter.

The intermediate portion may have such a shape that an outer diameter is continuously varied.

An entire length of the elastically deformable part may be contained within the inner periphery of the tubular part, in a range of relative movement of the first and second plungers.

A part of the pillar part which is adjacent to the elastically deformable part and which has a constant outer diameter may be contained within the inner periphery of the tubular part, in a range of relative movement of the first and second plungers.

According to the invention, there is also provided a socket comprising an insulating support body which holds a plurality of the contact probes.

In order to achieve the object, according to the invention, there is also provided a contact probe to be connected to an object to be inspected and a board for inspection, the contact probe comprising:

a first plunger including a first end portion which is bent; and a second plunger including a second end portion in which the first end portion is inserted, at least a part of an inner surface of the second end portion being in contact with at least a part of the bent first end portion.

BRIEF DESCRIPTION OF THE DRAWINGS

FIGS. 1A, 1B and 1C show a first embodiment of the invention, of which FIG. 1A is a sectional front view of a socket, FIG. 1B is a sectional front view of a contact probe, and FIG. 1C is a front view showing one of plungers (a first plunger) of the contact probe.

FIGS. 2A and 2B show contact points between the first plunger and the second plunger in the first embodiment, of which FIG. 2A is an enlarged sectional view for explaining repulsive forces generated by an elastically deformable part, and FIG. 2B is an enlarged sectional view showing electrical currents flowing between the first plunger and the second plunger.

FIGS. 7A and 7B show a related-art contact probe, of which FIG. 7A is a sectional front view, and FIG. 7B is an enlarged sectional view of a contact point between the first plunger and the second plunger.

DETAILED DESCRIPTION OF EMBODIMENTS

Figure 1A:
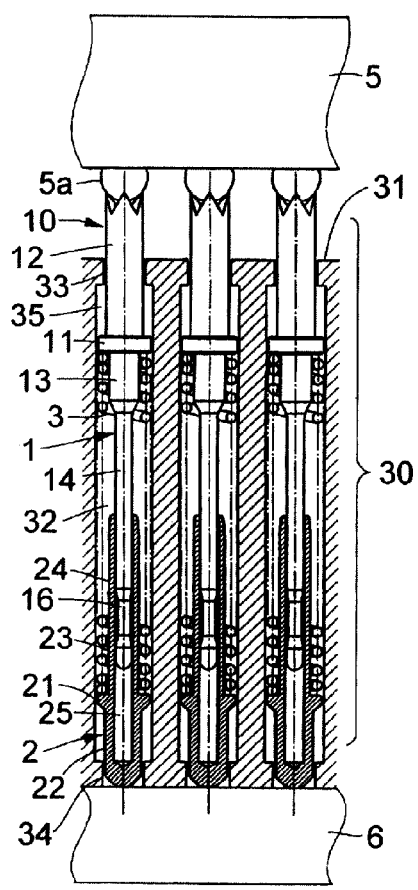

Now, preferred embodiments of the invention will be described referring to the drawings. It is to be noted that the same or equivalent constituent elements, members, processes and so on which are shown in the drawings will be denoted with the same reference numerals, and overlapped descriptions will be adequately omitted. Moreover, the embodiments do not limit the invention, but simply show the invention by way of examples. All features and combinations of them which are described in the embodiments are not always essential to the invention.

A first embodiment of the invention will be described referring to FIGS. 1A to 1C, and FIGS. 2A, 2B. In FIGS. 2A, 2B, an encircled part P in FIG. 1B which contains internal contact points of the contact probe is shown in an enlarged scale. In these drawings, a contact probe 10 has a first plunger 1, which is a connecting component to be contacted with an object to be inspected, a second plunger 2, which is a connecting component to be contacted with a board 6 for inspection, and a coil spring 3 for urging the first and second plungers in directions of moving them apart from each other. The object 5 to be inspected is, for example, a semiconductor integrated circuit on which electrodes are arranged at a determined interval. In the illustrated embodiment, electrode bumps 5a are arranged at a determined interval. The board 6 for inspection is provided with electrode pads (not shown) to be connected to a measuring instrument side, at a determined interval.

Figure 2A:
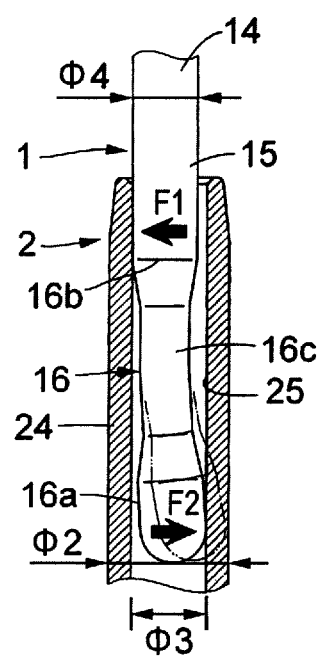
Figure 2B:
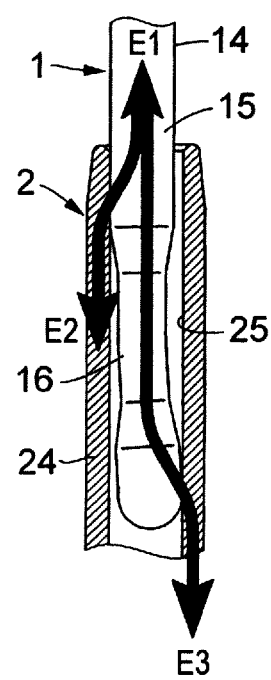

A socket 30 as shown in FIG. 1A includes an insulating support body 31 having hollow parts 32 for arranging a plurality of contact probes 10 in parallel at a determined interval. The contact probes 10 are inserted into and disposed in the respective hollow parts 32.

The first plunger 1 of the contact probe 10, which is a conductive metal body, is formed, for example, by employing beryllium-copper alloy as a matrix, and by plating it with gold on its surface. This first plunger 1 has a flange portion 11 at its middle part, and a distal end side ahead of the flange portion is formed as a distal end side body part 12. At an opposite side, there are formed a spring mounting part 13, and a sliding columnar part 14 which is extended from the spring mounting part 13. The sliding columnar part 14 has a basic diameter part 15 which is a straight column-like part having a constant outer diameter smaller than a diameter of the spring mounting part 13, and an elastically deformable part 16, as apparent from FIG. 1C, and FIGS. 2A, 2B. The elastically deformable part 16 is a bent part which has been bent so that it may have elasticity, and the diameter of its intermediate portion 16c is formed smaller than both end portions 16a, 16b (having the same diameter as the basic diameter part 15) for adjusting a repulsive force generated by elastic deformation. In this embodiment, the intermediate portion 16c has such a shape that a smaller tapered part interconnects two parts having a constant diameter, and a spring force is rather weakened by making the intermediate portion 16c smaller.

The second plunger 2 of the contact probe 10 is a conductive metal body formed of gold alloy or the like, and has a cylindrical shape which is closed at a distal end side (a lower end side) and provided with a flange portion 21 at a middle part of a cylindrical part 24. A distal end side beyond the flange portion 21 is formed as a distal end side body part 22, and an opposite side is formed as a spring mounting part 23.

The coil spring 3 for urging the first and second plungers 1, 2 in directions of moving them apart from each other may be formed of common material such as a piano wire, stainless steel wire, and so on.

Figure 1B:
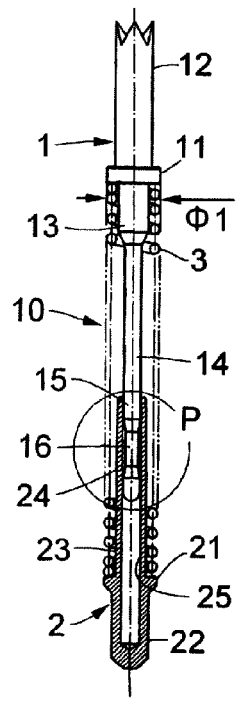
Figure 1C:
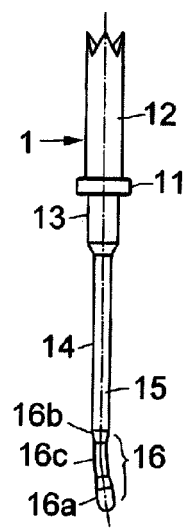

As shown in FIG. 1C, a bending amount of the elastically deformable part 16 of the first plunger 1 is set to be larger than a clearance between the basic diameter part 15 of the sliding columnar part 14 and an inner peripheral face 25 of the cylindrical part 24 of the second plunger 2. Therefore, the sliding columnar part 14 of the first plunger 1 comes into contact with the inner peripheral face 25 of the second plunger 2 at least at two contact points. As shown in FIG. 1B, the contact points between the first and second plungers 1, 2 are formed, by inserting the sliding columnar part 14 of the first plunger 1 inside the inner peripheral face 25 of the second plunger 2 thereby to position an entirety of the elastically deformable part 16 and a part of the basic diameter part 15 inside the inner peripheral face 25. Therefore, the contacts are made at one of the contact points which is positioned close to the distal end side body part 12 in an extending direction of the sliding columnar part 14, and at the other contact point which is positioned at an opposite side of the distal end side body part 12 and also positioned on a line in a direction parallel to the extending direction of the sliding columnar part 14, containing a part opposed to the aforesaid one contact point in a radial direction in the inner peripheral face 25. Then, as shown in FIG. 2A, a repulsive force F1 is exerted on the inner peripheral face 25 at the one contact point and a repulsive force F2 is exerted on the other contact point, due to elasticity of the elastically deformable part 16. As the results, a part of the sliding columnar part 14 (portions near both ends of the elastically deformable part 16, in FIG. 2A) is brought into elastic contact with the inner peripheral part 25. The spring 3 is provided between the flange portion 11 of the first plunger and the flange portion 21 of the second plunger 2. Specifically, one end of the spring 3 is fitted to an outer periphery of the spring mounting part 13, and the other end is fitted to an outer periphery of the spring mounting part 23.

The contact probe 10 which has been produced by assembling three members, namely, the first plunger 1, the second plunger 2 and the spring 3, as shown in FIG. 1B, is inserted and disposed in the hollow part 32 of the insulating support body 31 in FIG. 1A. Slidably supporting parts 33, 34 at open sides of the hollow part 32 slidably support (engage) the respective distal end side body parts 12, 22 of the first and second plungers 1, 2. An intermediate part 35 except the slidably supporting parts 33, 34 at the open sides has such an inner diameter that the flange portions 11, 21, and the spring 3 can freely move inside the intermediate part 35. Moreover, the insulating support body 31 can be divided into a plurality of layers so that the contact probe 10 can be incorporated in the hollow part 32 (not shown in the drawing).

For example, an outer diameter φ1 of a finished product of the contact probe 10 is 0.3 mm, an outer diameter φ2 of the cylindrical part 24 is 0.2 mm, and an inner diameter 3 of the cylindrical part 24 is 0.12 mm. Moreover, an outer diameter φ4 of the basic diameter part 15 is 0.1 mm. Further, the bending amount of the elastically deformable part 16 of the first plunger 1 is set to be larger than the clearance between the basic diameter part 15 of the sliding columnar part 14 and the inner peripheral face 25 of the cylindrical part 24 of the second plunger 2, which is 0.02 mm (φ3-φ4).

In the first embodiment, the one contact point is formed at a contact position between the basic diameter part 15 and/or the one end portion 16b of the elastically deformable part 16 which is positioned close to the distal end side body part 12 and the inner peripheral face 25, while the other contact point is formed at a contact position between the other end portion 16a of the elastically deformable part 16 and the inner peripheral face 25.

In case where the inspection is conducted using the socket 30 which has been assembled as shown in FIG. 1A, the socket 30 is positioned and placed on the board 6 for inspection. As the results, the distal end side body part 22 of the second plunger 2 is brought into elastic contact with the electrode pad of the board 6 for inspection.

In a state where the object 5 to be inspected such as the semiconductor integrated circuit is not provided, the first plunger 1 is moved in a projecting direction, until the flange portion 11 is restricted by the slidably supporting part 33 at the open side, and a projecting amount of the distal end side body part 12 is the largest. Because the object 5 to be inspected is disposed so as to be opposed to the insulating support body 31 of the socket 30 at a determined distance, the distal end side body part 12 retreats to compress the spring 3, and consequently, the distal end side body part 12 is brought into elastic contact with an electrode bump 5a of the object 5 to be inspected.

As has been described referring to FIGS. 1C and 2A, the bending amount of the elastically deformable part 16 of the first plunger 1 is set to be larger than the clearance between the basic diameter part 15 of the sliding columnar part 14 and the inner peripheral face 25 of the second plunger 2. Therefore, the repulsive forces F1, F2 due to the elasticity of the elastically deformable part 16 are exerted on the inner peripheral face 25, at the contact points of the first and second plungers 1, 2, and a part of the sliding columnar part 14 comes into elastic contact with the inner peripheral face 25. Accordingly, the contact points of the first and second plungers 1, 2 are always kept at a low and stabilized resistance value.

FIG. 2B shows internal electric paths inside the contact probe 10. An electric current E1 flowing from the first plunger 1 passes the second plunger 2 as an electric current E2 via the one contact point, and as an electric current E3 via the other contact point. On the contrary, the electric currents E2, E3 flowing from the second plunger 2 pass the first plunger 1 as the electric current E1.

Figure 7A:
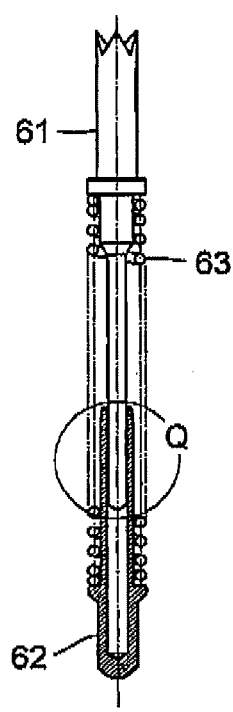
Figure 7B:
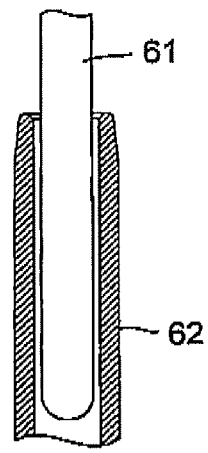
Figure 8:
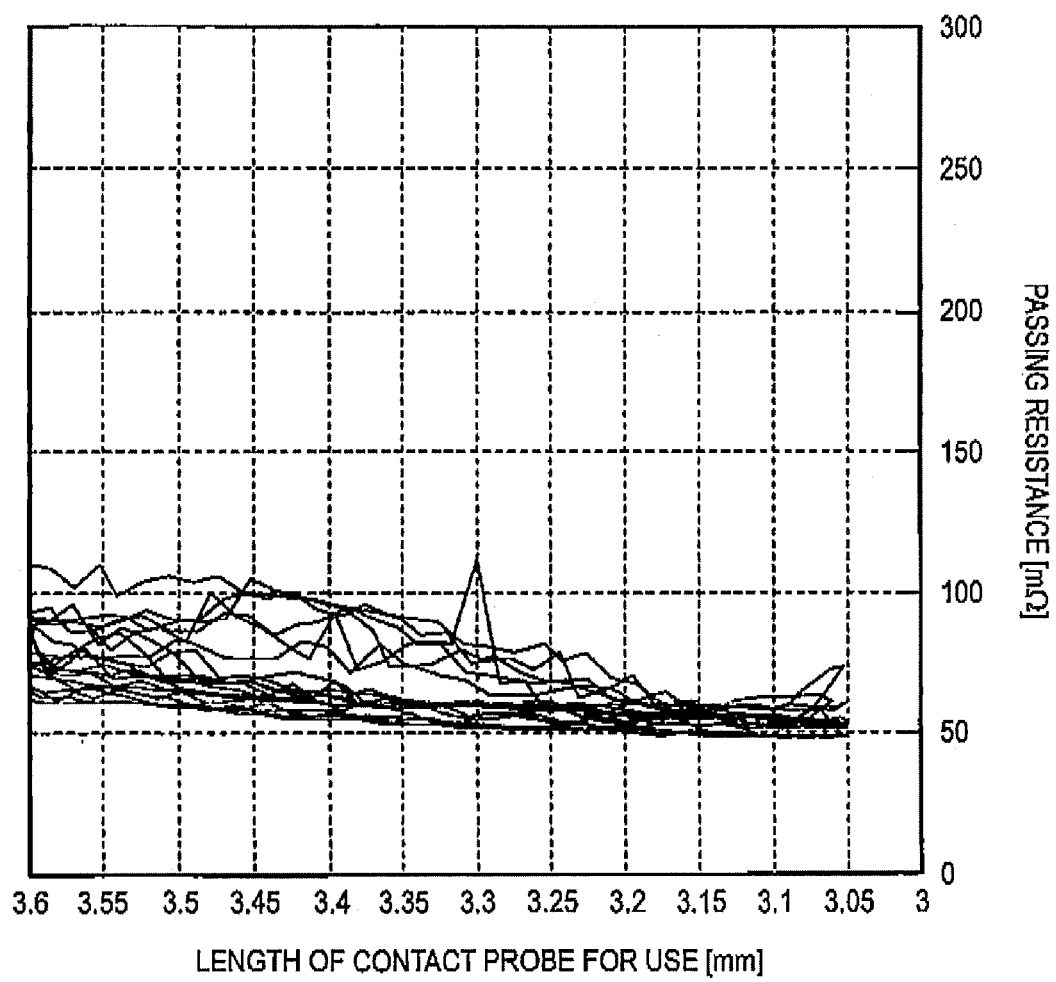
FIG. 8 is a graph showing characteristics of resistance values of the related-art contact probe as shown in FIG. 7.
Figure 10:
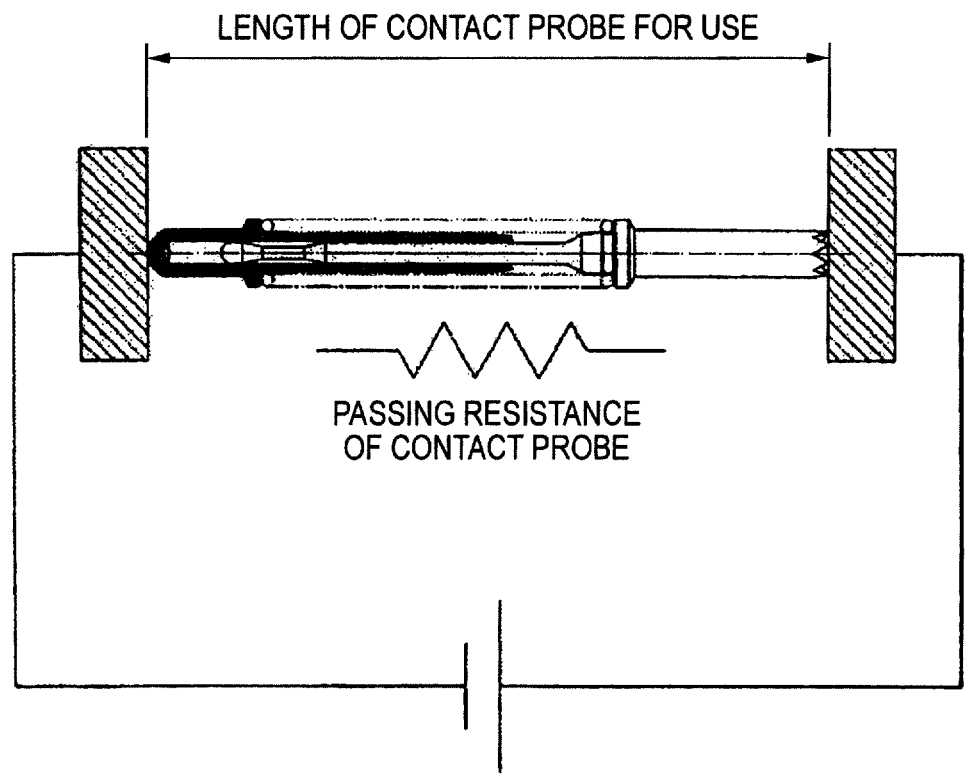
FIG. 10 is an explanatory view showing a method of measuring the characteristics of the resistance values of the contact probe.

FIG. 8 shows characteristics of resistance values of the related-art contact probe as shown in FIGS. 7A and 7B, which are results of measurement conducted on ten pieces of the contact probes as samples. As a method of measurement, the contact probe is clamped between electrodes which are connected to a constant voltage power supply, as shown in FIG. 10, and a length of the contact probe for use is varied to measure passing resistances of the contact probe, which are obtained from the electric current flowing through the contact probe. From the results of the measurement as shown in FIG. 8, it is found that there is a large dispersion among the samples, and the resistance values are high. It is also found that fluctuation of the resistance values is large, when the length of the contact probe for use is varied.

Figure 9:
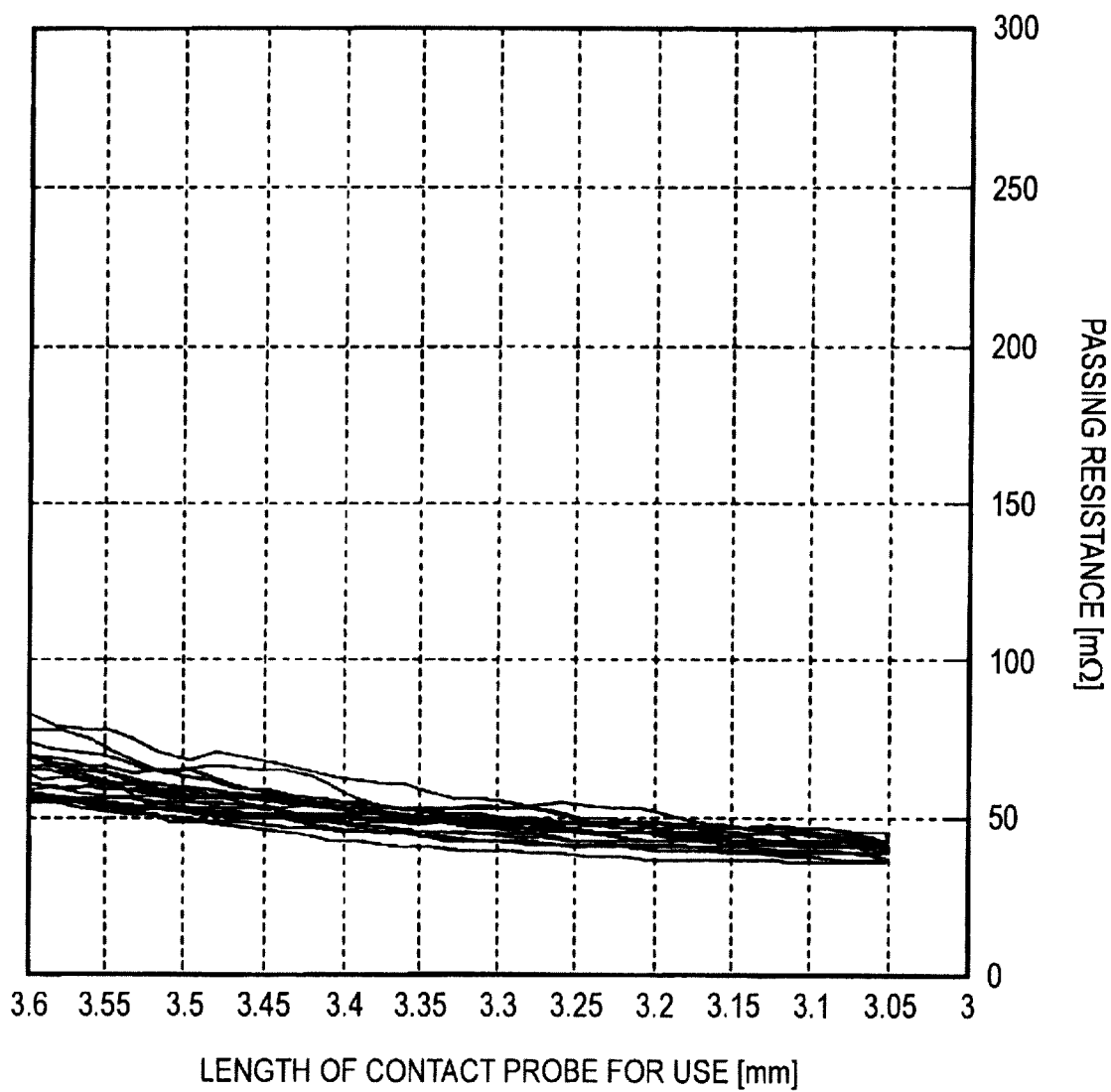
FIG. 9 is a graph showing characteristics of resistance values of the contact probe in the first embodiment according to the invention.

FIG. 9 shows characteristics of resistance values of the contact probe in the first embodiment of the invention, which are results of measurement conducted on ten pieces of the contact probes as samples. A method of the measurement is the same as in case of FIG. 8. From the results of the measurement as shown in FIG. 9, it is found that dispersion among the samples is small, and the resistance values are low. Moreover, it is also found that fluctuation of the resistance values is small, when the length of the contact probe for use is varied.

According to the embodiment of the invention, the following advantages can be obtained.

(1) The sliding columnar part 14 of the first plunger 1 is slidably engaged with the inner periphery of the cylindrical part 24 of the second plunger 2, and the sliding columnar part 14 has the elastically deformable part 16. The elastically deformable part 16 is in contact with the inner peripheral face 25 of the cylindrical part 24 with the repulsive forces F1, F2 (See FIG. 2A) generated by the elastic deformation, and hence, contact between the plungers (in other words, contacts at the contact points inside the contact probe) is always reliably maintained. As the results, it is possible to lower and stabilize the passing resistance of electricity.

(2) The contact probe 10 can be produced by common working technique, even though the outer diameter of the finished product is extremely small. Therefore, it is possible to realize the socket 30 which can be applied to a case where the electrodes are arranged at a small pitch (for example, at a pitch of about 0.4 mm) on the object 5 to be inspected such as the semiconductor integrated circuit.

(3) The elastically deformable part 16 of the first plunger 1 has the intermediate portion 16c which is smaller than the both end portions 16a, 16b, and hence, an appropriate spring performance can be obtained irrespective of the outer diameter of the sliding columnar part 14. In other words, the spring force of the elastically deformable part 16 (that is, the repulsive forces F1, F2) can be easily set at the appropriate value. This is because the spring force is weakened by making the intermediate portion 16c smaller, and slidability can be secured, even though the amount of the bending deformation is excessively large. By setting the spring force at the appropriate value, it is possible to maintain smooth sliding movement of the elastically deformable part 16 with respect to the inner peripheral face 25. Moreover, the end portion 16a of the elastically deformable part 16, which is an extreme end of the first plunger 1, has the same diameter as the basic diameter part 15, in a region engaged with the other contact point, and hence, the small amount of the bending deformation would be sufficient, as compared with a case where the end portion 16a of the elastically deformable part 16 has the same diameter as the intermediate portion 16c.

(4) A range of relative movement of the first and second plungers 1, 2 depends on a length of the intermediate part 35 of the hollow part 32 in the insulating support body 31. Within the range of the relative movement of the first plunger 1 with respect to the second plunger 2, an entire length of the elastically deformable part 16 and a part of the basic diameter part 15 continued to the elastically deformable part 16 and having a constant outer diameter, that is, the one and the other contact points are always contained in the inner periphery of the cylindrical part 24. Accordingly, it is possible to prevent occurrence of such a trouble that the amount of deformation of the elastically deformable part 16 may be varied by mistake, when the contact probe 10 and the socket 30 are assembled. Moreover, by constructing the contact probe in such a manner that the one and the other contact points are contained in the inner periphery of the cylindrical part 24, in a state where the spring 3 has been simply fitted to the spring mounting parts 13, 23 and is not yet compressed before it is assembled to the socket 30 (in a temporarily assembled state), it is possible to prevent occurrence of such a trouble that the amount of deformation of the elastically deformable part 16 is varied by mistake, when the contact probe is transported in the temporarily assembled state.

Figure 3:
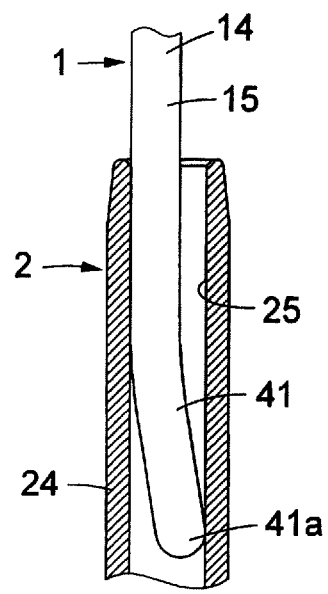
FIG. 3 is an enlarged sectional view showing the contact points between the first plunger and the second plunger in a second embodiment of the invention.

FIG. 3 shows a structure including the contact points between the first plunger 1 and the second plunger 2 in a second embodiment of the invention, in which an elastically deformable part 41 is formed having the same diameter as the basic diameter part 15. The first plunger 1 is in elastic contact with the inner peripheral face 25 of the cylindrical part 24 of the second plunger 2, at a part of the basic diameter part 15 and at an end portion 41a of the elastically deformable part 41, that is, an extreme end of the sliding columnar part 14 of the first plunger 1. The other structure is substantially the same as in the first embodiment which has been described above.

In this case, it is advantageous that the elastically deformable part 41 can be formed only by bending the sliding columnar part 14 of the first plunger 1. However, an amount of bending deformation of the elastically deformable part 41 must not be too much, in order to set the spring force at the appropriate value.

Figure 4:
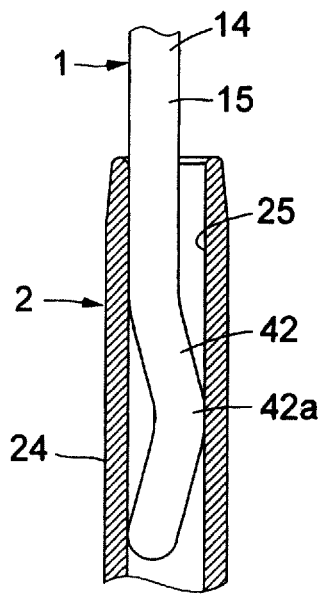
FIG. 4 is an enlarged sectional view showing the contact points between the first plunger and the second plunger in a third embodiment of the invention.

FIG. 4 shows a structure including the contact points between the first plunger 1 and the second plunger 2 in a third embodiment of the invention, in which an elastically deformable part 42 is formed having the same diameter as the basic diameter part 15. The first plunger 1 is in elastic contact with the inner peripheral face 25 of the cylindrical part 24 of the second plunger 2, at a part of the basic diameter part 15, at an intermediate point 42a of the elastically deformable part 42, that is, a position close to the extreme end of the sliding columnar part 14 of the first plunger 1, and at the extreme end of the sliding columnar part 14 (an end of the elastically deformable part 42). The other structure is substantially the same as in the first embodiment which has been described above.

In this case too, it is advantageous that the elastically deformable part 42 can be formed only by bending the sliding columnar part 14 of the first plunger 1. However, an amount of bending deformation of the elastically deformable part 42 must not be too much, in order to set the spring force at the appropriate value.

Figure 5:
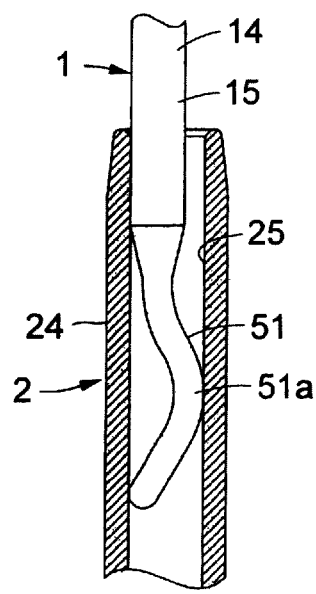
FIG. 5 is an enlarged sectional view showing the contact points between the first plunger and the second plunger in a fourth embodiment of the invention.

FIG. 5 shows a structure including the contact points between the first plunger 1 and the second plunger 2 in a fourth embodiment, in which an elastically deformable part 51 is formed having a smaller diameter than the basic diameter part 15 of the first plunger 1. The first plunger 1 is in elastic contact with the inner peripheral face 25 of the cylindrical part 24 of the second plunger 2, at a part of the basic diameter part 15, at an intermediate point 51a of the elastically deformable part 51, that is, a position close to the extreme end of the sliding columnar part 14 of the first plunger 1, and at the extreme end of the sliding columnar part 14 (an end of the elastically deformable part 51). The other structure is substantially the same as in the first embodiment which has been described above.

In this case, the spring force can be easily set at the appropriate value, because the elastically deformable part 51 is made smaller than the basic diameter part 15. Specifically, the spring force is weakened because the elastically deformable part 51 is made smaller, and hence, smooth sliding movement can be achieved with respect to the inner peripheral face 25, even though the amount of the bending deformation of the elastically deformable part 51 is excessively large.

Figure 6:
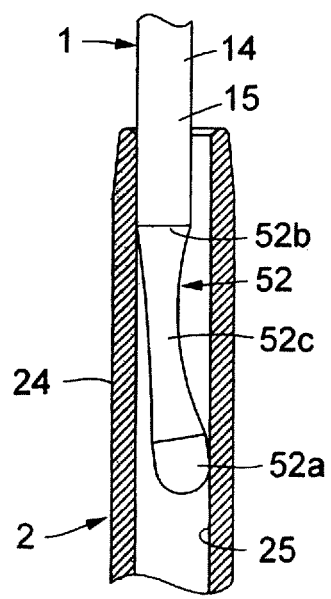
FIG. 6 is an enlarged sectional view showing the contact points between the first plunger and the second plunger in a fifth embodiment of the invention.

FIG. 6 shows a structure including the contact points between the first plunger 1 and the second plunger 2 in a fifth embodiment, in which an elastically deformable part 52 has an intermediate portion 52c which is gradually made smaller than its both end portions 52a, 52b (having the same diameter as the basic diameter part 15) by continuously varying its outer diameter. The first plunger 1 is in elastic contact with the inner peripheral face 25 of the cylindrical part 24 of the second plunger 2, at the basic diameter part 15 and/or at one end portion 52b of the elastically deformable part 52 which is positioned close to the distal end side body part 12, at the other end portion 52a of the elastically deformable part 52, that is, the extreme end of the sliding columnar part 14 of the first plunger 1. The other structure is substantially the same as in the first embodiment which has been described above.

In this case, the spring force can be easily set at the appropriate value, because the intermediate portion 52c of the elastically deformable part 52 is made smaller than the basic diameter part 15 of the sliding columnar part 14. Specifically, the spring force is weakened, because the intermediate portion 52c of the elastically deformable part 52 is made smaller, and hence, smooth sliding movement can be achieved with respect to the inner peripheral face 25, even though the amount of the bending deformation of the elastically deformable part 52 is excessively large. Moreover, because the end portion 52a of the elastically deformable part 52, which is the extreme end of the sliding columnar part 14, has the same diameter as the basic diameter part 15, the amount of the bending deformation of the elastically deformable part 52 may be smaller than the elastically deformable part 51 in the fourth embodiment, which is smaller along its entire length. Therefore, it is possible to secure smooth sliding performance in this respect too.

Although the invention has been described referring to the embodiments, as examples, it is to be understood by those skilled in the art that various modification can be added to the respective constituent elements and processes in the embodiments within a scope described in the claims. The modifications will be described below.

In the embodiments, the first plunger 1, which is a connecting component with respect to the object 5 to be inspected, has the sliding columnar part 14, while the second plunger 2, which is a connecting component with respect to the board 6 for inspection, has the cylindrical part 24. However, to the contrary, it is possible to form the cylindrical part in the first plunger 1, to form the sliding columnar part which is slidably engaged with the cylindrical part, in the second plunger 2, and to form the elastically deformable part in the sliding columnar part.

According to an aspect of the invention, in a contact probe having a first plunger to be connected to an object to be inspected, and a second plunger to be connected to a board for inspection, a pillar part of one of the plungers is slidably engaged with an inner periphery of a tubular part of the other plunger, the pillar part having an elastically deformable part, and the elastically deformable part is in contact with an inner peripheral face of the tubular part with a repulsive force due to elastic deformation. Therefore, contact between the plungers that is, the contact at the internal contact point of the contact probe can be reliably maintained. As the results, the passing resistance of electricity can be lowered and stabilized.

Moreover, it is possible to produce the contact probe by common working technique, even in case where an outer diameter of a finished product is extremely small, and consequently, it is possible to realize the socket which can be applied to a case where electrodes are arranged at a small pitch on the object to be inspected such as a semiconductor integrated circuit.

What is claimed is:

1. A contact probe comprising:

a first plunger to be connected to an object to be inspected;

a second plunger to be connected to a board for inspection; and a spring operable to urge the first and second plungers in directions of moving the first and second plungers apart from each other, wherein a pillar part of one of the first and second plungers is slidably engaged with an inner periphery of a tubular part of the other of the first and second plungers, the pillar part includes an elastically deformable part which is in contact with a part of the inner periphery of the tubular part, wherein the elastically deformable part includes end portions and an intermediate portion between the end portions, and the intermediate portion is smaller than the end portions in diameter.

2. The contact probe according to claim 1, wherein the elastically deformable part is in contact with the part of the inner periphery of the tubular part with a repulsive force generated by elastic deformation.

3. The contact probe according to claim 1, wherein the intermediate portion has such a shape that an outer diameter is continuously varied.

4. The contact probe according to claim 1, wherein an entire length of the elastically deformable part is contained within the inner periphery of the tubular part, in a range of relative movement of the first and second plungers.

5. The contact probe according to claim 1, wherein a part of the pillar part which is adjacent to the elastically deformable part and which has a constant outer diameter is contained within the inner periphery of the tubular part, in a range of relative movement of the first and second plungers.

6. A socket comprising an insulating support body which holds a plurality of the contact probes according to claim 1.

* * * * *